(12) United States Patent  
Richt et al.

(10) Patent No.: US 9,190,974 B2  
(45) Date of Patent: Nov. 17, 2015

(54) METHOD AND A DEVICE FOR CONTROLLING THE LEVEL OF A PULSED HIGH-FREQUENCY SIGNAL

(75) Inventors: Norbert Richt, Markt Schwaben (DE); Joachim Danz, Ottobrunn (DE)

(73) Assignee: ROHDE & SCHWARZ & GMBH CO. KG, Munich (DE)

( * ) Notice: Subject to any disclaimer, the term of this patent is extended or adjusted under 35 U.S.C. 154(b) by 370 days.

(21) Appl. No.: 13/606,074

(22) Filed: Sep. 7, 2012

(65) Prior Publication Data

US 2013/0064319 A1    Mar. 14, 2013

(30) Foreign Application Priority Data

Sep. 8, 2011   (DE) .................. 10 2011 082 351

(51) Int. Cl.
  *H04K 1/02*   (2006.01)
  *H04L 25/03*  (2006.01)
  *H04L 25/49*  (2006.01)
  *H03G 3/30*   (2006.01)

(52) U.S. Cl.
  CPC ................................. *H03G 3/3042* (2013.01)

(58) Field of Classification Search
  CPC ...... H40B 7/10; H40B 1/71637; H40B 1/719; H40B 14/02; H04L 27/01; H04L 25/03834; H04L 27/265; H04L 5/0044; H04L 27/368; H04L 25/03343; H04L 27/02; H04L 5/023; H04L 27/3405; G01S 13/0209; H01Q 9/005; H01Q 13/08; H03F 1/3247; H03F 1/3294; H03F 2201/3233; H03M 5/12

USPC .............. 375/130–217, 219–239, 242–315, 375/295–297, 238, 256, 295–296, 309, 375/311–313, 353

See application file for complete search history.

(56) References Cited

U.S. PATENT DOCUMENTS

| | | | | |
|---|---|---|---|---|
| 3,603,998 A | * | 9/1971 | Kassel ......................... | 342/123 |
| 3,980,825 A | * | 9/1976 | Morrien ........................ | 375/282 |
| 4,001,823 A | * | 1/1977 | Matsui et al. .................. | 342/90 |
| 5,054,116 A | | 10/1991 | Davidson | |
| 5,661,442 A | * | 8/1997 | Sparks .......................... | 332/149 |
| 6,539,213 B1 | * | 3/2003 | Richards et al. ............ | 455/226.3 |
| 7,756,487 B2 | * | 7/2010 | Lerner et al. .................... | 455/76 |
| 2001/0053175 A1 | * | 12/2001 | Hoctor et al. ................. | 375/130 |
| 2009/0180576 A1 | * | 7/2009 | Rulla ............................ | 375/320 |
| 2009/0212997 A1 | * | 8/2009 | Michalski ..................... | 342/137 |

* cited by examiner

*Primary Examiner* — James M Perez

(74) *Attorney, Agent, or Firm* — Ditthavong & Steiner, P.C.

(57) ABSTRACT

A method and a device for controlling the level of a pulsed high-frequency signal amplify or respectively attenuate an un-pulsed high-frequency signal with an amplification or attenuation element adjustable with regard to its amplification or attenuation factor. A pulsed high-frequency signal is generated by a pulse modulator controlled by a pulse signal from the un-pulsed high-frequency signal. At the output of the pulse modulator, a signal level of the pulsed high-frequency signal is measured by a high-frequency detector. The amplification or attenuation factor of the amplification or attenuation element is adjusted with a level controller controlled by the measured signal level. To control the level controller, the measured signal level of the pulsed high-frequency signal is linked to the measured signal level of the pulse signal.

14 Claims, 2 Drawing Sheets

METHOD AND A DEVICE FOR CONTROLLING THE LEVEL OF A PULSED HIGH-FREQUENCY SIGNAL

CROSS-REFERENCE TO RELATED APPLICATION

The present application claims priority to German patent application DE 10 2011 082 351.4 filed on Sep. 8, 2011. The entire contents of which are herein incorporated by reference.

BACKGROUND OF THE INVENTION

1. Field of the Invention

The invention relates to a method and a device for controlling the level of a pulsed high-frequency signal.

2. Discussion of the Background

Pulsed high-frequency signals can be generated in signal generators. In this context, a high-frequency signal generated by a frequency synthesiser is supplied to a pulse modulator which is controlled by a pulse signal. For the duration of a single pulse of the pulse signal, the high-frequency signal is conducted from the input to the output of the pulse modulator. By contrast, for the duration of the single pulse pauses of the pulse signal, the high-frequency signal is not conducted from the input to the output of the pulse modulator.

In controlling a level of a pulsed high-frequency signal, the signal level of the pulsed high-frequency signal is registered at the output of the pulse modulator with a detector and compared with a reference value. Dependent upon this control difference, an adjustment signal is generated with a level controller, with which the amplification or respectively attenuation factor of an amplification or attenuation element disposed upstream of the pulse modulator is adjusted. In this manner, the signal level of the pulsed high-frequency signal is controlled to the desired reference value. Because of the time dynamic of the detector, the level controller and the amplification or attenuation element, such a level control provides a limited control bandwidth, which typically extends up to a few megahertz.

During the pulse pauses of the pulse signal, the signal level of the pulsed high-frequency signal provides a value of zero, or approximately zero, and can therefore not be registered by the detector. Accordingly, the level control cannot meaningfully operate during the pulse pauses of the pulse signal. Opening the pulse control during the pulse pauses of the pulse signal is known from U.S. Pat. No. 5,054,116.

Conversely, because of its limited control bandwidth, it is not possible for the level control to complete the control process fully to its conclusion in short pulse pauses of the pulse signal. Accordingly, in the case of pulsed high-frequency signals, a level control in pulse mode often takes place only in comparatively long pulses of the pulse signal or not at all. For example, if the signal level of the pulsed high-frequency signal changes, for example, because of temperature drift or another influence, the pulse mode is cancelled, and the level control for the un-pulsed high-frequency signal is activated. If the level control of the un-pulsed high-frequency signal reaches the specified reference value, the level control is switched off, the value of the present adjustment signal is held constant in the level controller, and the pulse mode is reactivated. However, level changes of the pulsed high-frequency signal disadvantageously remain in existence until the next level control is activated. Moreover, supplying a device under test with an un-pulsed high-frequency signal during a level control of relatively long duration can cause undesirable damage to the device under test.

SUMMARY OF THE INVENTION

The object of the invention is therefore to provide a device and a method for controlling the level of a pulsed high-frequency signal, which are also activated as far as possible during the pulse mode of the high-frequency signal.

According to the invention, the level controller is controlled with a signal, which originates from the linking of the signal level of the pulsed high-frequency signal measured at the output of the pulse modulator and the measured signal level of the pulse signal—preferably as a quotient of the measured signal level of the pulsed high-frequency signal over the measured signal level of the pulse signal. The time-variable power of the respective signal is preferably measured as the signal level. As an alternative, the time-variable amplitude of the respective signal can also be registered as the signal level.

If the transient behaviour of the signal level of the pulsed high-frequency signal in the case of the transition from a pulse pause to a pulse or from a pulse to a pulse pause of the pulse signal is ignored and in the case of an interference-determined drift of the signal level of the pulsed high-frequency signal, the quotient of the measured signal level of the pulsed high-frequency signal over the measured signal level of the pulse signal always provides the same value in the presence of stationary conditions—that is, after the completion of the transient process—in the case of a pulse pause and also in the case of a pulse of the pulse signal.

In this manner, it is possible to implement a level control not only during the pulse phases of the pulse signal but also to control the level of the pulsed high-frequency signal continuously during the pulses and the pulse pauses of the pulse signal, apart from the exceptional case explained below. Accordingly, in the settled condition of the level control after the completion of the transient process, control bandwidths smaller than 1 Hz are possible, because only comparatively slow drifts of the signal level of the pulsed high-frequency signal need to be settled. As will be explained below, this allows a comparatively low-noise level control.

To ensure that this behaviour of the level control occurs, the signal paths from the detector which measures the signal level of the pulse signal to the unit which implements the quotient formation, and from the detector which measures the signal level of the pulsed high-frequency signal to the unit which implements the quotient formation should preferably be identical with regard to stationary and dynamic properties. In order to achieve identical stationary properties, the two detectors should provide identical amplification factors. In order to realise identical behaviour with regard to dynamics, the two detectors should preferably provide identical rise and fall times and identical bandwidths. Moreover, identical dynamic behaviour in the two paths preferably requires identical delay times from each detector to the unit which implements the quotient formation.

If the difference between the measured signal level of the pulsed high-frequency signal and the measured signal level of the pulse signal falls below a specified second threshold value, the level control will switch over from the quotient formation to a difference formation between the measured signal level of the pulsed high-frequency signal and the signal level of the pulse signal. In this manner, with a difference of the registered signal level between the pulse signal and the pulsed high-frequency signal converging towards zero, the integrating component of the level controller, which is realised as a proportional-integrating controller, approximates a constant value, and the settling process of the level control is completed.

Since an unavoidable noise is additionally superposed over the two signals generated by the two detectors dependent upon the signal level of the respectively measured signal, this noise must preferably be attenuated or removed in the case of a small signal-noise interval through a corresponding adjustment of the control bandwidths—low-pass characteristic with appropriately selected threshold frequency—of the level controller.

In pulse pauses of the pulse signal, the signal level of the pulse signal is compared with an appropriately selected first threshold value. If the signal level of the pulse signal falls below the first threshold value in the case of relatively long pulse pauses of the pulse signal, the level controller is stopped. This prevents the difference between the registered signal level of the pulse signal and the pulsed high-frequency signal supplied to the level controller from providing only noise-signal components and accordingly making a meaningful adjustment of the signal level of the pulsed high-frequency signal impossible.

BRIEF DESCRIPTION OF THE DRAWINGS

An exemplary method according to the invention and an exemplary device according to the invention for controlling the level of a pulsed high-frequency signal are explained in detail below with reference to the drawings. The drawings are as follows.

DETAILED DESCRIPTION OF EMBODIMENTS OF THE INVENTION

Figure 1:
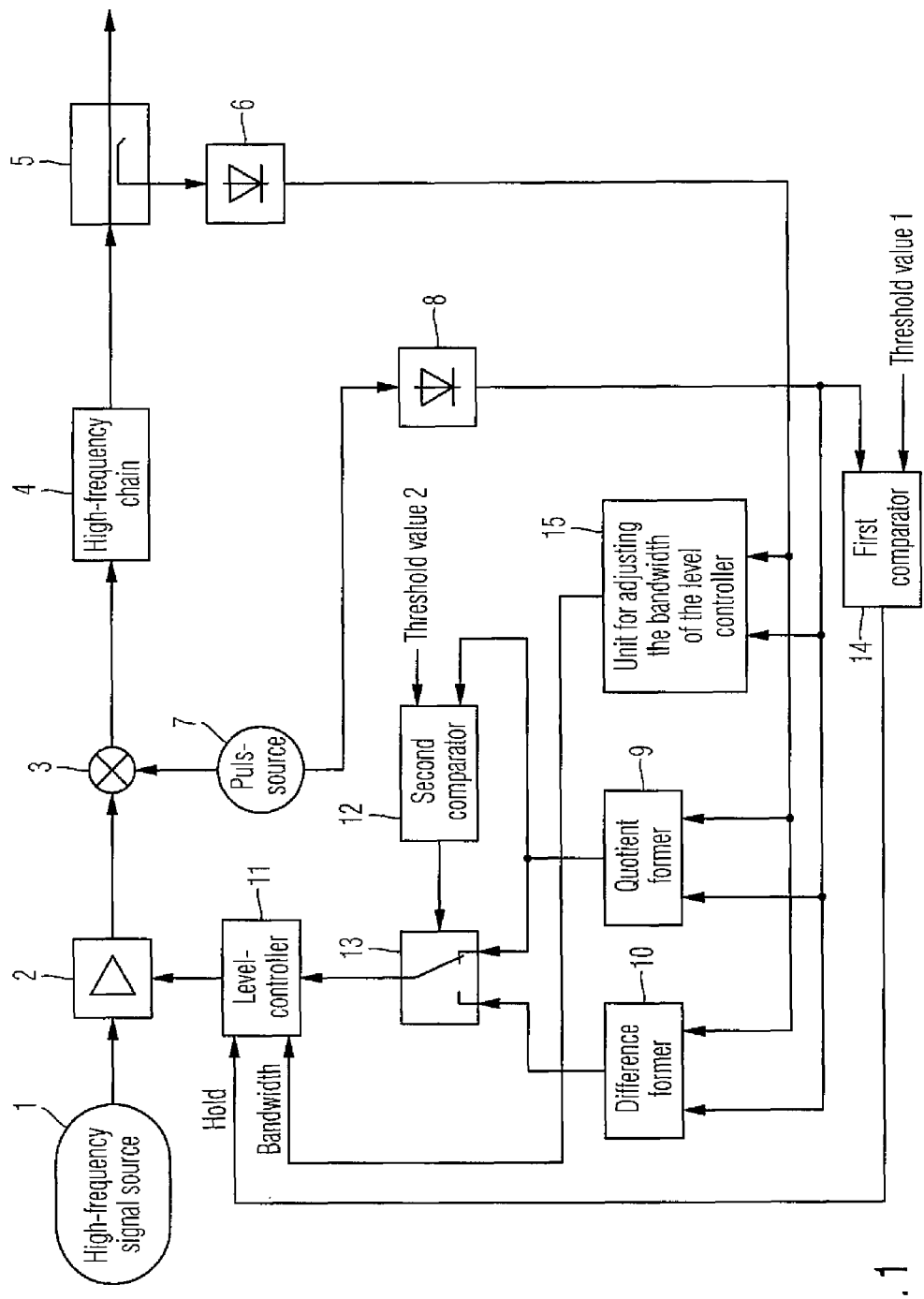
FIG. 1 shows a block-circuit diagram of an exemplary embodiment of the device according to the invention for controlling the level of the pulsed high-frequency signal.
Figure 2:
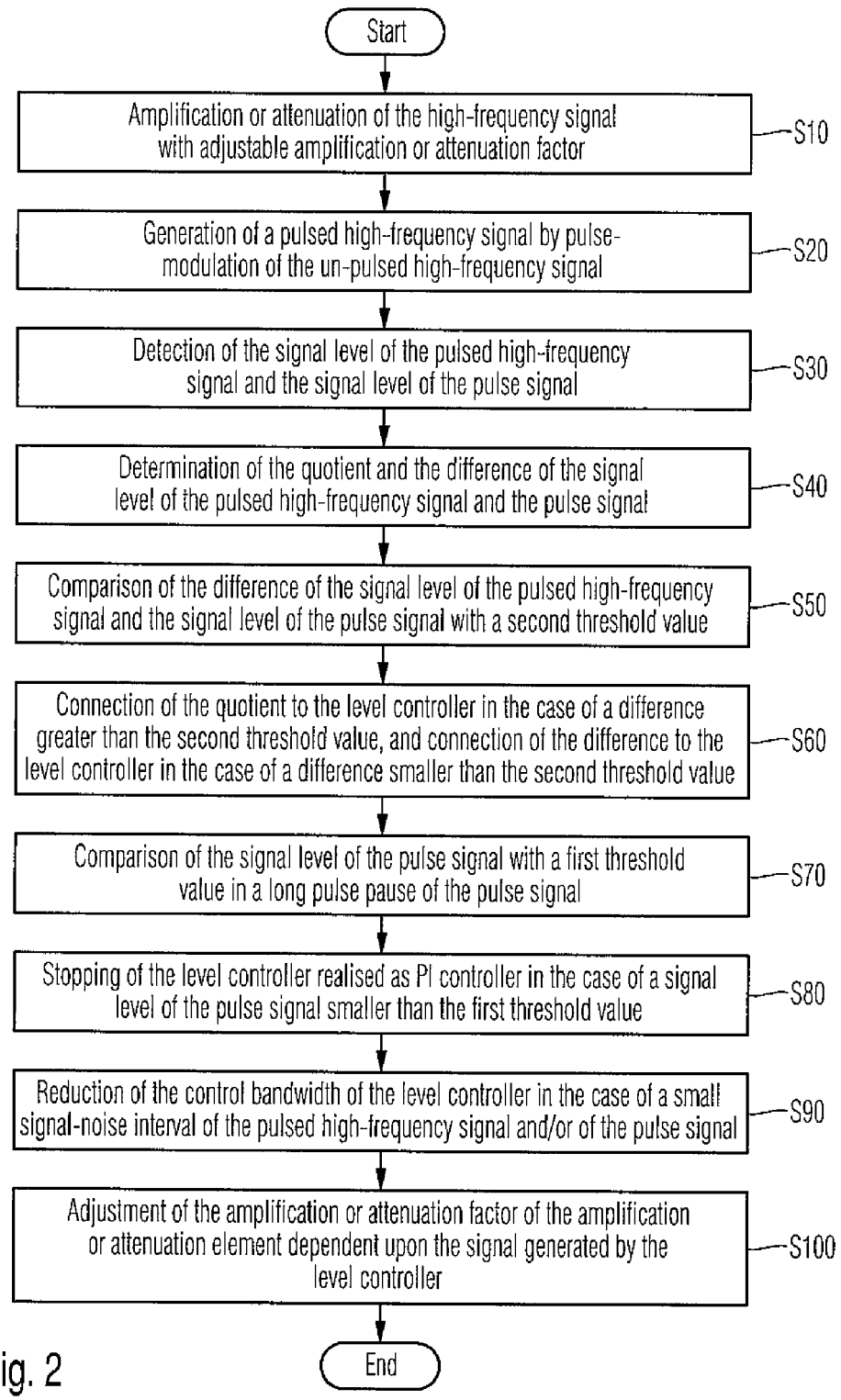
FIG. 2 shows a flow diagram of an exemplary embodiment of the method according to the invention for controlling the level of a pulsed high-frequency signal.

In the following section, the exemplary embodiment of the method according to the invention for controlling the level of a pulsed high-frequency signal is explained in detail with reference to the flow diagram in FIG. 2 in combination with the exemplary embodiment of the device according to the invention for controlling the level of a pulsed high-frequency signal with reference to the block circuit diagram of FIG. 1.

In the first method step S10, the un-pulsed high-frequency signal generated by a high-frequency signal source 1—preferably by a high-frequency synthesiser—is amplified or respectively attenuated in an amplification or attenuation element 2 adjustable with regard to its amplification or attenuation factor.

In the next method step S20, the amplified or respectively attenuated, un-pulsed high-frequency signal is converted by means of a pulse signal in a pulse modulator 3 into a pulsed high-frequency signal.

In the next method step S30, the pulsed high-frequency signal is decoupled via a directional coupler 5 from the high-frequency path 4 adjoining the pulse modulator 3, which is preferably implemented as a high-frequency chain or high-frequency line. The decoupled, pulsed high-frequency signal is registered with regard to its signal level in an adjoining high-frequency detector 6. The high-frequency detector 6 is preferably a so-called RMS detector (Route Mean Square, German: Wurzel des quadratischen Mittelwerts), which measures the actual power of the pulsed high-frequency signal independently of its time characteristic. Other power detectors for high-frequency signals can, of course, also be used, for example, an Average-(AV)-detector (German: Mittelwert-Detektor) can be used as an alternative, and are also covered by the invention. Detectors for registering the amplitude—of the peak value—of the pulsed high-frequency signal can be used to register the signal level of the pulsed high-frequency signal and are also covered by the invention.

In parallel, within the same method step S30, the signal level of the pulse signal generated by a pulse source 7 and supplied to the pulse modulator 3 is detected in a detector 8 for registering the signal level of the pulse signal. Here also, suitable detectors for registering the signal power or the signal amplitude of a pulse signal can be used and are also covered by the invention.

In the subsequent method step S40, the quotient Q(t) of the registered signal level Soll(t) of the pulse signal over the registered signal level Ist(t) of the pulsed high-frequency signal is determined in a unit 9 for the formation of a quotient according to equation (1), and the difference D(t) between the registered signal level Soll(t) of the pulse signal and the registered signal level Ist(t) of the pulsed high-frequency signal is determined in a unit 10 for the formation of a difference according to equation (2).

$$Q(t) = \frac{Soll(t)}{Ist(t)} \qquad (1)$$

$$D(t) = Soll(t) - Ist(t) \qquad (2)$$

Since the level controller 11, which is still to be explained, is embodied as a proportional-integrating controller, a constant value of the quotient Q(t) typically different from zero in the pulse phases of the pulse signal would lead to a continuously rising signal at the output of the integrator associated with the proportional-integrating controller and accordingly to a continuously rising adjustment signal instead of an adjustment signal settling to a constant value at the output of the level controller 11. In order to avoid this undesirable control behaviour of the level controller 11, in the case of a diminishing difference between the registered signal levels of the pulse signal and the pulsed high-frequency signal, the level controller 11 is controlled with the difference D(t) between the registered signal level of the pulse signal and the pulsed high-frequency signal instead of the quotient Q(t) of the registered signal level of the pulse signal over the registered signal level of the pulsed high-frequency signal. A difference D(t) between the registered signal levels of the pulse signal and the pulsed high-frequency signal converging towards zero in the control process leads to an adjustment signal at the output of the level controller 11 with a constant value after the completion of the settling process.

For this purpose, in the next method step S50, the difference D(t) generated in the unit 10 for forming a difference between the registered signal levels of the pulse signal and the pulsed high-frequency signal is compared with a suitably selected second threshold value.

So long as the difference D(t) between the registered signal levels of the pulse signal and the pulsed high-frequency signal is disposed above the second threshold value, and the level control is accordingly disposed in a coarse phase of the settling process, the level controller 11 is supplied, in the subsequent method step S60, via a switch 13 controlled by the output signal of the second comparator 12 with the quotient Q(t) of the registered signal level of the pulse signal over the registered signal level of the pulsed high-frequency signal. If the difference D(t) between the registered signal level of the pulse signal and the pulsed high-frequency signal falls below the second threshold value, and accordingly, the level control is disposed in the fine phase of the settling process, the difference D(t) between the registered signal levels of the pulse signal and the pulsed high-frequency signal is connected via the switch 13 to the level controller 11.

Since the signals generated by the two detectors 6 and 8 depend not only upon the registered signal levels of the pulsed high-frequency signal and the pulse signal, but also provide superposed noise-signal components, the quotient Q(t) according to equation (3) and the difference D(t) according to equation (4) also comprise the noise-signal components $N_{Soll}(t)$ in the signal path of the registered signal level of the pulse signal and $N_{Ist}(t)$ in the signal path of the registered signal level of the pulsed high-frequency signal, alongside the registered signal levels Soll(t) and Ist(t) of the pulse signal and of the pulsed high-frequency signal. In the case of a large signal-noise interval, the influences of the noise-signal components $N_{Soll}(t)$ and $N_{Ist}(t)$ on the signal level of the pulsed high-frequency signal to be adjusted are negligible. However, in the case of a small signal-noise interval, especially in the case of short pulses and long pulse pauses of the pulse signal, these noise-signal components are undesirably modulated via the level controller 11 to the signal level of the pulsed high-frequency signal adjusted by the level control and cannot always be ignored.

$$Q(t) = \frac{Soll(t) + N_{Soll}(t)}{Ist(t) + N_{Ist}(t)} \quad (3)$$

$$D(t) = Soll(t) + N_{Soll}(t) - Ist(t) - N_{Ist}(t) \quad (4)$$

The situation in relatively long pulse pauses of the pulse signal, in which not only the registered signal level Soll(t) of the pulse signal is zero, but also the registered signal level Ist(t) of the pulsed high-frequency signal approaches the value zero, is extremely critical. In this case, the level controller receives only the difference D'(t) between the two noise signal components $N_{Soll}(t)$ and $N_{Ist}(t)$ as a control signal according to equation (5) and cannot determine a practicable adjustment signal from this for adjusting the amplification or respectively attenuation factor of the amplification or attenuation element 2.

$$D'(t) = N_{Soll}(t) - N_{Ist}(t) \quad (5)$$

In the next method step S70, in order to avoid the last-named, extremely critical situation, the registered signal level Soll(t) of the pulse signal is compared in a first comparator 14 with a first, suitably selected threshold value. The selection of the first threshold value depends, on the one hand, upon the required level-accuracy of the pulsed high-frequency signal and, on the other hand, upon the hardware used for the level control circuit, especially upon the accuracy of the detectors 6 and 8, which are realised in an analog or digital manner, upon the digital resolution of the functional units of the level control, which are typically realised digitally, and accuracy in the adjustment of the amplification or respectively attenuation factor of the amplification or attenuation element 2, and should be dimensioned accordingly.

If the registered signal level Soll(t) of the pulse signal falls below the first threshold value, and accordingly, a difference value D'(t) is present, which is dependent only upon the noise-signal components $N_{Soll}(t)$ in the signal path of the registered signal level of the pulse signal and $N_{Ist}(t)$ in the signal path of the registered signal level of the pulsed high-frequency signal, in the next method step S80, the level controller 11 is stopped at the currently determined value of the adjustment signal and frozen until the registered signal level Soll(t) of the pulse signal falls below the first threshold value again.

In the next method step S90, in order to avoid undesirable modulation of the noise-signal components to the signal level of the pulsed high-frequency signal in the case of a small signal-noise interval in the signal path of the detector signals generated by the two detectors 6 and 8, the signal-noise interval in the output signal of the high-frequency detector 6 and of the detector 8 is determined in a unit 15 for adjusting the bandwidth of the level controller, in order to measure the signal level of the pulse signal, and compared with a third suitably selected threshold value. If the two determined signal-noise intervals are disposed below the third threshold value, and accordingly, a strong amplitude noise of the signal level of the pulsed high-frequency signal can be expected, the bandwidth of the level controller 11 is reduced appropriately under the control of the unit 15 for adjusting the bandwidth of the level controller by varying the adjustment time of the integrator contained in the proportional-integrating level controller 11.

In the final method step S100, the amplification or respectively attenuation factor of the amplification or attenuation element 2 is adjusted dependent upon the adjustment signal generated by the level controller 11 or stopped.

The device according to the invention and the method according to the invention for controlling the level of a pulsed high-frequency signal are not restricted to the exemplary embodiment presented. All combinations of any of the features claimed in the patent claims or features disclosed in the description and features illustrated in the drawings are covered by the invention.

The invention claimed is:

1. A method for controlling a level of a pulsed high-frequency signal, comprising:
   Amplifying an un-pulsed high-frequency signal with an amplification element adjustable with regards to its amplification factor,
   Generating a pulsed high-frequency signal from the amplified un-pulsed high-frequency signal with a pulse modulator controlled by a pulse signal,
   Measuring a signal level of the pulsed high-frequency signal at an output of the pulse modulator with a high-frequency detector,
   Measuring a signal level of the pulse signal with a second detector,
   Adjusting the amplification factor of the amplification element with a level controller controlled by a linkage control signal, and
   Generating and outputting the linkage control signal by generating a quotient of the measured signal level of the pulse signal over the measured signal level of the pulsed high-frequency signal.

2. The method for level control according to claim 1, whereby a control bandwidth of the level controller is reduced at times in which a small signal-noise interval of the measured signal level of the pulse signal is present or a small signal-noise interval of the measured signal level of the pulsed high-frequency signal is present.

3. The method for level control according to claim 2, whereby the control bandwidth of the level controller is reduced in a case of short pulses and long pulse pauses in the measured signal level of the pulse signal.

4. The method for level control according to claim 1, whereby an operation of the level controller is stopped in a case of long pulse pauses of the measured signal level of the pulse signal and in a case that the measured signal level of the pulse signal is smaller than a first threshold value.

5. The method for level control according to claim 4, whereby the level controller is alternatively controlled with a difference between the measured signal level of the pulse signal and the measured signal level of the pulsed high-frequency signal in a case of a relatively small difference, by comparison with a second threshold value, between the measured signal level of the pulse signal and the measured signal level of the pulsed high-frequency signal.

6. A device for controlling a level of a pulsed high-frequency signal, comprising:
    an amplification element adjustable with regard to its amplification factor and supplied with an un-pulsed high-frequency signal,
    a downstream pulse modulator controlled by a pulse signal, that generates a pulsed high-frequency signal from the amplified un-pulsed high frequency signal,
    a downstream high-frequency detector for measurement of a signal level of the pulsed high-frequency signal generated at an output of the pulse modulator,
    a level controller controlled using the measured signal level of the pulsed high-frequency signal to adjust the amplification factor of the amplification element, and
    a unit is provided for linking the measured signal level of the pulsed high-frequency signal to a measured signal level of the pulse signal, wherein the level controller is controlled,
    wherein to control the level controller, the unit for linking the measured signal level of the pulsed high-frequency signal to the measured signal level of the pulse signal includes a unit for forming a quotient of the measured signal level of the pulse signal over the measured signal level of the pulsed high-frequency signal.

7. The device for level control according to claim 6, wherein to control the level controller, the unit for linking the measured signal level of the pulsed high-frequency signal to the measured signal level of the pulse signal also includes a unit for forming a difference between the measured signal level of the pulse signal and the measured signal level of the pulsed high-frequency signal.

8. The device for level control according to claim 6, wherein a second detector is provided for measuring the signal level of the pulse signal and generates the measured signal level of the pulse signal, and the second detector and the high-frequency detector have substantially similar rise and fall times.

9. The device for level control according to claim 8, wherein the second detector and the high-frequency detector have substantially similar bandwidths.

10. The device for level control according to claim 8, wherein a delay time of the signal generated by the second detector is substantially similar to a delay time of the signal generated by the high-frequency detector.

11. The device for level control according to claim 6, further comprising:
    a unit for adjusting a bandwidth of the level controller is connected upstream of the level controller.

12. The device for level control according to claim 6, further comprising:
    a first comparator for comparing the measured signal level of the pulse signal with a first threshold value is connected upstream of the level controller.

13. The device for level control according to claim 6, further comprising:
    a switch that is connected upstream of the level controller, the switch for selectively connecting the quotient or a difference of the measured signal level of the pulsed high-frequency signal and the measured signal level of the pulse signal to the level controller.

14. The device for level control according to claim 13, wherein control of the switch is implemented via a second comparator for comparing the difference of the measured signal level of the pulsed high-frequency signal and the measured signal level of the pulse signal with a second threshold value.

\* \* \* \* \*